United States Patent
Pickel et al.

(10) Patent No.: US 12,255,268 B2
(45) Date of Patent: *Mar. 18, 2025

(54) OPTOELECTRONIC SEMICONDUCTOR CHIP AND METHOD FOR PRODUCTING AN OPTOELECTRONIC SEMICONDUCTOR CHIP

(71) Applicant: OSRAM OLED GmbH, Regensburg (DE)

(72) Inventors: Sebastian Pickel, Regensburg (DE); Johannes Saric, Regensburg (DE); Wolfgang Schmid, Gundelshausen (DE); Anna Strozecka-Assig, Regensburg (DE); Johannes Baur, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/619,924

(22) Filed: Mar. 28, 2024

(65) Prior Publication Data

US 2024/0274753 A1 Aug. 15, 2024

Related U.S. Application Data

(63) Continuation of application No. 18/180,992, filed on Mar. 9, 2023, now Pat. No. 12,015,107, which is a
(Continued)

(30) Foreign Application Priority Data

Mar. 15, 2018 (DE) .......................... 102018106001.7
Mar. 29, 2018 (DE) .......................... 102018107673.8

(51) Int. Cl.
*H01L 33/46* (2010.01)
*H01L 33/38* (2010.01)
(Continued)

(52) U.S. Cl.
CPC ............ *H01L 33/38* (2013.01); *H01L 33/387* (2013.01); *H01L 33/405* (2013.01); *H01L 33/42* (2013.01);
(Continued)

(58) Field of Classification Search
CPC ..... H01L 33/38; H01L 33/387; H01L 33/405; H01L 33/42; H01L 33/30; H01L 33/60; H01L 33/44–46
See application file for complete search history.

(56) References Cited

U.S. PATENT DOCUMENTS 11,631,787 B2   4/2023   Pickel et al.
12,015,107 B2*  6/2024   Pickel ................... H01L 33/405
(Continued)

FOREIGN PATENT DOCUMENTS

CN   104969365 A   10/2015
CN   102414826 B2   4/2017
(Continued)

OTHER PUBLICATIONS

First Office Action issued in corresponding Chinese Patent Application No. 201980019438.5 dated May 9, 2024, with English language translation, 20 pages.
(Continued)

*Primary Examiner* — Wasiul Haider
(74) *Attorney, Agent, or Firm* — MH2 Technology Law Group LLP

(57) ABSTRACT

In one embodiment, the optoelectronic semiconductor chip includes a semiconductor layer sequence with an active zone for generating a radiation. The semiconductor layer sequence is based on AlInGaP and/or on AlInGaAs. A metal mirror for the radiation is located on a rear side of the semiconductor layer sequence opposite a light extraction side. A protective metallization is applied directly to a side
(Continued)

of the metal mirror facing away from the semiconductor layer sequence. An adhesion promoting layer is located directly on a side of the metal mirror facing the semiconductor layer sequence. The adhesion promoting layer is an encapsulation layer for the metal mirror, so that the metal mirror is encapsulated at least at one outer edge by the adhesion promoting layer together with the protective metallization.

20 Claims, 4 Drawing Sheets

Related U.S. Application Data continuation of application No. 16/980,910, filed as application No. PCT/EP2019/056458 on Mar. 14, 2019, now Pat. No. 11,631,787.

(51) Int. Cl.
 *H01L 33/40* (2010.01)
 *H01L 33/42* (2010.01)
 *H01L 33/30* (2010.01)

(52) U.S. Cl.
 CPC .............. *H01L 33/46* (2013.01); *H01L 33/30* (2013.01); *H01L 2933/0016* (2013.01); *H01L 2933/0025* (2013.01)

(56) References Cited

U.S. PATENT DOCUMENTS

| | | |
|---|---|---|
| 2004/0201027 A1 | 10/2004 | Ghosh |
| 2012/0049228 A1 | 3/2012 | Walter et al. |
| 2012/0098016 A1 | 4/2012 | Hoppel et al. |
| 2012/0280263 A1 | 11/2012 | Ibbetson et al. |
| 2014/0217457 A1 | 8/2014 | Cho et al. |
| 2015/0357525 A1 | 12/2015 | Sasaki |
| 2016/0087173 A1 | 3/2016 | Mayer et al. |
| 2016/0211420 A1 | 7/2016 | Donofrio et al. |
| 2016/0351754 A1 | 12/2016 | Kim et al. |
| 2017/0069372 A1 | 3/2017 | Kodama et al. |
| 2017/0331009 A1 | 11/2017 | Shioji |
| 2017/0373228 A1 | 12/2017 | Chang et al. |
| 2018/0076362 A1 | 3/2018 | Jeon et al. |
| 2018/0351046 A1* | 12/2018 | Baur .................. H01L 33/22 |
| 2019/0027654 A1 | 1/2019 | Höppel et al. |
| 2019/0044027 A1 | 2/2019 | Lee et al. |
| 2019/0051805 A1 | 2/2019 | Oh et al. |
| 2019/0058088 A1 | 2/2019 | Jung et al. |
| 2019/0067526 A1 | 2/2019 | Kim et al. |
| 2019/0131497 A1 | 5/2019 | Höppel |
| 2020/0194641 A1 | 6/2020 | Ziegler |
| 2020/0411725 A1 | 12/2020 | Kim et al. |
| 2021/0005784 A1 | 1/2021 | Pickel et al. |
| 2022/0384689 A1 | 12/2022 | Strozecka-Assig |

FOREIGN PATENT DOCUMENTS

| | | |
|---|---|---|
| CN | 106611811 A | 5/2017 |
| CN | 207065248 U | 3/2018 |
| DE | 102015118041 A1 | 4/2017 |
| DE | 102017101637 A1 | 8/2018 |
| KR | 20120014972 A | 2/2012 |
| WO | 2017057978 A1 | 4/2017 |
| WO | 2017069372 A1 | 4/2017 |

OTHER PUBLICATIONS

Ashcroft, "Homogeneous Semiconductors", Solid state physics, 2005, 61 pages.
Anonymous, "Datasheet: Metal Can® TO18, SFH 4860", Osram Os, Jul. 16, 2019, 14 pages.
Anonymous, "Transistor Outline (TO) Package Types", EESemi.com, Accessed Nov. 4, 2018, 4 pages.
Haferkorn, "Radiation physical quantities", Radiation physics and Light technology, 2003, 11 pages.
Illek et al., "Scalability of buried micro-reflector light emitting diodes for high-current applications", Integrated Optoelectronics Devices, 2003, 8 pages.
Vinh et al., "Measurement and Modeling of the LED Light Source", LED Lighting: Technology and Preception, 2015, 51 pages.
Evangeline, H, "Osram Revs up Wuxi Plant with the 2nd Phase of Back-end Production Project ", LED Inside, Aug. 11, 2017, 2 pages.
Christine Strasser, "Osram focuses on high-tech Regensburg", Economy, Jan. 12, 2018, 8 pages.
Anonymous, "Investments of about €3 billion create new growth prospects for Osram", Osram Opto Semiconductors, Oct. 11, 2015, 3 pages.
Nishi et al., "Handbook of Semiconductor Manufacturing Technology", Marcel Dekker, Inc. , Sep. 16, 2020, 20 pages.
Schubert, "Light-Emitting Diodes Second Edition", New York: Cambridge University Press, 2006, 14 pages.
Streubel et al., "High brightness AlGaInP light-emitting diodes", IEEE Journal of Selected Topics in Quantum Electronics, vol. 8, No. 2, 2002, 12 pages.
Xia et al., "Chemical Vapor Deposition", Handbook of Semiconductor Manufacturing Technology, 2000, 48 pages.

* cited by examiner

OPTOELECTRONIC SEMICONDUCTOR CHIP AND METHOD FOR PRODUCING AN OPTOELECTRONIC SEMICONDUCTOR CHIP

CROSS-REFERENCE TO RELATED APPLICATIONS

This patent application is a continuation of U.S. patent application Ser. No. 18/180,992 filed Mar. 9, 2023, which is a continuation of U.S. patent application Ser. No. 16/980 910 filed Sep. 15, 2020, now U.S. Pat. No. 11,631,787, which is a national stage entry from International Application No. PCT/EP2019/056458, filed on Mar. 14, 2019, published as International Publication No. WO 2019/175334 A1 on Sep. 19, 2019, and claims priority under 35 U.S.C. § 119 from German patent applications 10 2018 106 001.7, filed Mar. 15, 2018, and 10 2018 107 673.8 filed Mar. 29, 2018, the entire contents of all of which are incorporated by reference herein.

FIELD OF THE INVENTION

An optoelectronic semiconductor chip is specified. Furthermore, a method for producing such a semiconductor chip is specified.

BACKGROUND

The document US 2012/0098016 A1 describes a silver mirror of an InGaN LED encapsulated by atomic layer deposition.

One task to be solved is to specify an optoelectronic semiconductor chip that has a mirror with a permanently high reflectivity.

This task is solved, inter alia, by an optoelectronic semiconductor chip and by a method with the features of the independent claims. Preferred further embodiments are the subject of the dependent claims.

SUMMARY

According to at least one embodiment, the optoelectronic semiconductor chip is intended for radiation generation, in particular for the generation of near-ultraviolet radiation, visible light and/or near-infrared radiation. The semiconductor chip is for example a light emitting diode chip or a laser diode chip. Preferably the semiconductor chip is an LED chip for generating green, yellow, orange or red light.

According to at least one embodiment, the semiconductor chip comprises a semiconductor layer sequence. The semiconductor layer sequence contains at least one active zone for generating radiation. The active zone is preferably located between a p-doped side and an n-doped side of the semiconductor layer sequence. In particular, the active zone contains a single quantum well structure, a multiple quantum well structure and/or a pn junction. The active zone extends in particular perpendicularly to a growth direction of the semiconductor layer sequence.

The semiconductor layer sequence is preferably based on a III-V compound semiconductor material. The semiconductor material is for example a phosphide compound semiconductor material such as $Al_nIn_{1-n-m}Ga_mP$ or an arsenide compound semiconductor material such as $Al_nIn_{1-n-m}Ga_mAs$ or such as $Al_nGa_mIn_{1-n-m}As_kP_{1-k}$, where $0 \leq n \leq 1$, $0 \leq m \leq 1$ and $n+m \leq 1$ and $0 \leq k < 1$ respectively. Preferably for at least one layer or for all layers of the semiconductor layer sequence $0 < n \leq 0.8$, $0.4 \leq m < 1$ and $n+m \leq 1$ as well as $0 < k \leq 1$ The semiconductor layer sequence may contain dopants and additional components. For the sake of simplicity, however, only the essential constituents of the crystal lattice of the semiconductor layer sequence, i.e. Al, As, Ga, In and/or P, are given, even if these may be partially replaced and/or supplemented by small amounts of other substances.

According to at least one embodiment, the semiconductor chip comprises a metal mirror. The metal mirror is located on a rear side of the semiconductor layer sequence. The metal mirror is configured as a reflection layer and is configured to reflect the radiation generated during operation. In particular, radiation components are reflected at the metal mirror, which arrive at the metal mirror from the semiconductor layer sequence through a reflector made of materials transparent for the radiation.

In at least one embodiment, the optoelectronic semiconductor chip comprises a semiconductor layer sequence with an active zone for generating radiation. The semiconductor layer sequence is based on AlInGaP and/or AlInGaAs. A metal mirror for the radiation is located on a rear side of the semiconductor layer sequence opposite a light extraction side. A protective metallization is directly attached to a side of the metal mirror facing away from the semiconductor layer sequence. An adhesion promoting layer is located directly on a side of the metal mirror facing the semiconductor layer sequence. The adhesion promoting layer is an encapsulation layer for the metal mirror, so that the metal mirror is encapsulated at least on one outer edge by the adhesion promoting layer together with the protective metallization against external influences.

Silver, i.e. Ag, is a material that is desirable as a mirror in light-emitting diodes, or LEDs for short, due to its high reflectivity. At the same time, however, when silver is used in a mirror, long-term stability of the LED in high ambient humidity becomes critical. Various moisture-induced phenomena can occur, including Ag migration, delamination or chemical degradation of layers. With the semiconductor chip described here, it is possible to encapsulate Ag against the influences of an external environment in InGaAlP/AlGaAs light-emitting diodes and thus achieve high stability under moisture conditions.

The concept of InAlP/AlGaAs light-emitting diodes, which are manufactured using thin-film technology, usually comprises a highly reflective mirror formed from a dielectric and a metal layer behind it. The dielectric part of the mirror typically consists of a single thick layer, but can also be formed by several dielectric layers of different materials. For the metal layer, a material with a high reflectivity from the green spectral range to the infrared is chosen, for example Au or Ag.

Further aspects for the mirror construction are:
(I) The materials of the mirror should be robust and stable under humidity and other environmental influences.
(II) Good adhesion between the dielectric and the metal is required.

To fulfill the first condition, Au is usually the material of choice for InAlP/AlGaAs LEDs. The second condition is usually achieved by using an adhesion promoting layer. Typical here is a TCO material such as ITO or ZnO. However, TCOs do not act efficiently as a moisture barrier, so the metal layer directly at the interface to the dielectric is not protected from moisture.

Ensuring the stability of the mirror structure under high humidity is not trivial, especially if the metal of choice is not moisture stable itself, as in the case of Ag. This problem is due in particular to the many ways in which moisture can penetrate the LED and reach the metal portion of the mirror:
  A) Edges of the metal layer are open at one chip edge. The material of the metal mirror is in direct contact with the moisture in the environment.
  B) Moisture penetrates the LED at an interface of the metal mirror to the adhesive layer or through the adhesive layer. This may happen especially if the adhesive layer at the interface degrades or delaminates.
  C), D): Moisture penetrates the LED through the dielectric layer or reflector. This can happen if the dielectric material is porous and does not form a barrier against moisture. Moisture can either pass through the adhesive layer on the surface region to the metal mirror or in a contact region where the mirror material is in direct contact with the dielectric.

The semiconductor chip described here is based in particular on the following ideas:
  i) The new adhesion promoting layer simultaneously ensures good adhesion and acts as a moisture barrier, so that the large mirror surface is protected from any moisture that penetrates the metal from the dielectric. The new adhesion promoting layer should have a high uniformity along edges, steps or other elements of the morphology. An example of a preferred suitable material is aluminum oxide, the preferred deposition process is ALD, where ALD stands for Atomic Layer Deposition. ALD may be used to produce highly conformal layers with well controlled thickness and composition. Aluminum oxide layers deposited in this way act as a very effective moisture barrier as long as its surface remains covered by another material. This means that the adhesion promoting layer is placed between two layers. In this way, the moisture path mentioned above under C) is closed. Ideally, the adhesion promoting layer and its upper and lower interface are robust, so that the path mentioned above under B) is also closed.
  ii) To remove the metal of the metal mirror from a chip edge, the metal mirror is structured. The mirror is then encased by a metal layer, the protective metallization, which protects a rear side and the edges of the mirror. In this way the moisture path A) is closed. If necessary, the chip edge between the moisture-blocking adhesive layer and the protective metallization can be protected by an additional layer. If this further layer is not electrically conductive, it is removed from the chip surface in places to allow current to flow.
  iii) The mirror is structured in an electrical contact region. The encapsulating metal for the protective metallization is deposited in an opening in the metal mirror. In this way, the metal mirror is separated from the dielectric in the contact region and blocks path D). At the same time, the material of the protective metallization becomes part of the electrical contact to the semiconductor layer sequence.
  iv) In addition, a second moisture barrier layer may be incorporated to protect the chip side edges. In this way, moisture can be prevented from penetrating into the dielectric, especially the reflector, and its interfaces to adjacent layers, see paths B), C) and D). To achieve this, the reflector is removed in a region outside the mesa, i.e. in a separation trench between adjacent regions of the semiconductor layer sequence for the semiconductor chips. The sides of the dielectric reflector are then covered with a moisture barrier. Preferred for the moisture barrier layer is also aluminum oxide. The moisture barrier layers from both sides of the chip meet in the separation trench.

The aspects of the semiconductor chip mentioned under i) to iv) can be used separately or in combination, depending on the choice of materials and the complexity of the chip processing.

According to at least one embodiment, the semiconductor chip comprises at least one contact layer. The contact layer is preferably made of a transparent conductive oxide. The contact layer directly adjoins the semiconductor layer sequence and is configured to inject current into the semiconductor layer sequence.

According to at least one embodiment, the metal mirror is a silver mirror. Alternatively, the metal mirror can be an aluminium mirror or a gold mirror.

According to at least one embodiment, the metal mirror, in particular silver of the metal mirror, ends at a distance from the contact layer and/or from the semiconductor layer sequence. This means that the metal mirror and especially silver-containing layers do not touch the contact layer and/or the semiconductor layer sequence.

According to at least one embodiment, the adhesion promoting layer is made of a metal oxide. The adhesion promoting layer may be of a dielectric oxide such as aluminum oxide. Alternatively, the adhesion promoting layer is of an electrically conductive material such as a transparent conductive oxide. Less preferably, the adhesion promoting layer can also be of at least one metal or metal nitride such as Pt, Ti, Pd, W and/or WN. In particular, in the case of a metallic adhesion promoting layer, the adhesion promoting layer is preferably thin, for example not more than 10 nm or 5 nm or 2 nm thick.

Transparent conductive oxides, or TCOs for short, are transparent, electrically conductive materials, usually metal oxides, such as zinc oxide, tin oxide, cadmium oxide, titanium oxide, indium oxide or indium tin oxide, ITO for short. In addition to binary metal oxygen compounds, such as Zno, $SnO_2$ or $In_2O_3$, ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p-doped or n-doped; for example, in the case of ZnO, doping with Al and/or Ga is preferred.

According to at least one embodiment, the adhesion promoting layer is produced by atomic layer deposition, ALD for short, or molecular layer deposition, MLD for short. This allows a specific diffusion constant of the adhesion promoting layer, especially for water and oxygen, of at most $10^{-5}$ g/(m$^2$ d) to be achieved, calculated on a material thickness of 0.1 μm. Preferably, the diffusion constant is at most $5 \times 10^{-5}$ g/(m$^2$ d), in particular at most $10^{-6}$ g/(m$^2$ d). Such a material for the adhesion promoting layer can ensure that significant corrosion or chemical destruction of the metal mirror can be prevented within a lifetime of the semiconductor layer sequence.

An encapsulation layer produced by ALD or MLD, such as the adhesion promoting layer, differs from layers produced by CVD or PVD in particular in that a defect density for the ALD adhesion promoting layer is typically less than 0.1 defects per square millimetre, whereas a defect density of several 100 defects per square millimetre occurs in CVD or PVD layers. This can be detected by transmission electron microscopy, or TEM for short. Due to the comparatively lower defect density of the ALD adhesion promoting layer, an etching rate is also reduced compared to CVD or PVD layers. For example, the defect density and/or the etching rate can be used to determine which method was used to produce a layer. CVD stands for Chemical Vapour Deposition, PVD for Physical Vapour Deposition.

According to at least one embodiment, the protective metallization is a stack of several metal layers. Alternatively, protective metallization is a single metal layer.

According to at least one embodiment, a region between the semiconductor layer sequence and the protective metallization is free of cavities. In particular, no cavities or gaps are created laterally next to the metal mirror. Preferably, side surfaces of the metal mirror are covered by the protective metallization over the entire surface and directly.

According to at least one embodiment, the semiconductor chip comprises one or more electrical through-connections for electrical contacting, in particular the p-doped side. The through-connections are preferably formed by the metal mirror and/or the protective metallization. The through-connection preferably extends to a side of the semiconductor layer sequence or the contact layer facing the metal mirror. Thus the through-connection ends at a distance from the active zone and does not pass through the active zone.

According to at least one embodiment, the adhesion promoting layer is spaced apart from a region of the through-connection closest to the semiconductor layer sequence. Thus, it is possible that a region between the through-connection and the semiconductor layer sequence or a region between the through-connection and the contact layer is free of the adhesion promoting layer. Alternatively, the adhesion promoting layer can extend continuously and uninterruptedly across the through-connection if the adhesion promoting layer is electrically conductive.

According to at least one embodiment, the adhesion promoting layer partially or completely covers side flanks of the through-connection. The side flanks are preferably also covered by the metal mirror. This allows increased reflectivity to be achieved on the side flanks.

According to at least one embodiment, the through-connection is formed by the metal mirror in a region closest to the semiconductor layer sequence. In this case, the protective metallization preferably does not reach the semiconductor layer sequence and/or the contact layer.

According to at least one embodiment, the protective metallization in the through-connection reaches closer to the semiconductor layer sequence than adjacent regions of the metal mirror. For example, the metal mirror in the through-connection is V-shaped and the protective metallization fills up this V.

According to at least embodiment, the through-connection is formed by the protective metallization in a region closest to the semiconductor layer sequence. Thus the protective metallization may touch the semiconductor layer sequence and/or the contact layer. This means that the through-connection or the through-connections may be formed by the protective metallization so that the mirror layer ends at a distance from the semiconductor layer sequence and preferably also at a distance from the optional contact layer.

According to at least one embodiment, the semiconductor chip comprises a reflector. The reflector is made of at least one material that is transparent for the radiation generated during operation. The reflector may be composed of several layers with different refractive indices for the radiation generated during operation. Preferably, the reflector is electrically insulating, but can alternatively be electrically conductive. Preferably, the reflector is located directly between the semiconductor layer sequence and the adhesion promoting layer. In other words, the adhesion promoting layer is preferably used to firmly bond the metal mirror to the reflector and to prevent the metal mirror from detaching from the reflector and thus from the semiconductor layer sequence.

The layers of the reflector with different refractive indices are for example made of: i) $SiO_2$ with n=1.46 and $Nb_2O_5$ with n=2.3, ii) $SiO_2$ and $TiO_2$ with n=2.3 to 2.4, iii) $MgF_2$ with n=1.37 and $Nb_2O_5$, iv) $MgF_2$ and $TiO_2$. The values given for the refractive indices are exemplary for a temperature of 300 K and for a wavelength of 616 nm.

According to at least one embodiment, the reflector is made of a material which is transparent for the radiation generated during operation and which is in particular low refractive. Low refractive may mean that the refractive index of the reflector at the semiconductor layer sequence is smaller by at least 0.5 or 1 or 1.5 than an average refractive index of the semiconductor layer sequence. At least one material of the reflector is for example an oxide, a nitride or an oxynitride.

According to at least one embodiment, the reflector comprises a comparatively large optical thickness. The term optical thickness refers to a product of a geometrical thickness of the respective layer and its refractive index with respect to a wavelength L of maximum intensity of the radiation generated during operation. Preferably, the reflector has an optical thickness of at least 0.5 L or 1.0 L. Alternatively or additionally, this optical thickness is at most 5 L or 3 L or 2 L.

According to at least one embodiment, the reflector is electrically insulating. In this case the reflector is penetrated by the through-connection.

According to at least one embodiment, the reflector projects beyond the semiconductor layer sequence and/or the metal mirror in plan view. Alternatively, the reflector may be flush with the semiconductor layer sequence and/or the metal mirror. It is also possible that the semiconductor layer sequence and/or the metal mirror protrude above the reflector.

According to at least one embodiment, the reflector is directly adjacent to the protective metallization in regions that are next to the semiconductor layer sequence in plan view. This means that the adhesion promoting layer may be removed at one edge of the semiconductor chip.

According to at least one embodiment, the adhesion promoting layer and the protective metallization projects laterally beyond the semiconductor layer sequence. This makes it possible for the metal mirror to protrude laterally beyond the semiconductor layer sequence. This allows a high reflectivity to be achieved over the entire surface. Lateral means, for example, in the direction perpendicular to a growth direction and/or main extension direction of the semiconductor layer sequence.

According to at least one embodiment, the metal mirror, viewed in cross-section, borders all around exclusively to the protective metallization together with the adhesion promoting layer. This allows the metal mirror to be efficiently encapsulated.

According to at least one embodiment, the contact layer is electrically ohmically connected to the metal mirror and/or the protective metallization. A current flow into the semiconductor layer sequence then occurs via the metal mirror and/or the protective metallization into the contact layer.

According to at least one embodiment, the adhesion promoting layer reaches up to the contact layer. This allows the side flanks of the through-connections to be almost completely covered by the metal mirror.

According to at least one embodiment, the first side of the semiconductor layer sequence, especially the p-doped side, has a greater thickness in the region of the through-connection than in other regions. The thicker region of the first side of the semiconductor layer sequence preferably extends, starting from the through-connections, over the semiconductor layer sequence. This means that the thicker region of the first side need not be limited to the through-connections, although this is possible. In particular, the semiconductor layer sequence under metallic electrical current distribution structures on the light extraction side is thin so that the active zone is not supplied with current there.

According to at least one embodiment, the contact layer only extends over part of the semiconductor layer sequence. In particular, the contact layer is limited to the regions of the semiconductor layer sequence with the greater thickness. Thus, a current widening can be specifically adjusted by means of the contact layer. Alternatively, the entire semiconductor layer sequence or almost the entire semiconductor layer sequence on the rear side is completely covered by the contact layer.

According to at least one embodiment, the adhesion promoting layer has a uniform, constant thickness at least across the metal mirror. This can be achieved in particular by producing the adhesion promoting layer by means of ALD or MLD.

According to at least one embodiment, different regions of the adhesion promoting layer do not overlap each other. This means that the adhesion promoting layer is preferably applied in only one layer. In particular, the adhesion promoting layer is free of regions that are U-shaped when viewed in cross-section. The adhesion promoting layer is then free of undercuts.

According to at least one embodiment, the semiconductor chip comprises at least one cover layer. Preferably, the cover layer extends from the light extraction side over the side flanks of the semiconductor layer sequence up to the adhesion promoting layer. The semiconductor layer sequence can thus be enclosed by the cover layer together with the adhesion promoting layer and the protective metallization when viewed in at least one cross-section or in all cross-sections parallel to a growth direction of the semiconductor layer sequence and through the semiconductor layer sequence.

According to at least one embodiment, the cover layer and the adhesion promoting layer are made of the same material, in particular aluminum oxide. Preferably, the cover layer and the adhesion promoting layer are produced by ALD or MLD.

According to at least one embodiment, the cover layer is covered with a moisture protection layer, preferably over the entire surface. The moisture protection layer can be a protective layer for the cover layer. For example, the moisture protection layer is made of a nitride like silicon nitride. The cover layer and/or the moisture protection layer may be applied at or in a roughening of the semiconductor layer sequence.

According to at least one embodiment, the semiconductor chip is a component based on an arsenide or a phosphide. The wavelength of maximum intensity of the radiation generated during operation is preferably at least 560 nm or 590 nm and/or at most 950 nm or 840 nm or 700 nm. In particular, red light is generated with the semiconductor chip during normal operation.

In addition, a method for producing a semiconductor chip as described in connection with one or more of the above mentioned embodiments is specified. Features of the semiconductor chip are therefore also disclosed for the method and vice versa.

In at least one embodiment, the method serves to produce an optoelectronic semiconductor chip and comprises the following steps, preferably in the order given:
A) Growing the semiconductor layer sequence, which is of AlInGaP or AlInGaAs,
B) Deposition and/or structuring of the adhesion promoting layer,
C) Deposition and/or structuring of the metal mirror so that the metal mirror partially or completely covers the adhesion promoting layer,
D) Applying the protective metallization to the metal mirror and to or on the adhesion promoting layer; and
E) Detaching a growth substrate for the semiconductor layer sequence.

The adhesion promoting layer, for example, is produced with a tolerance of not more than 30 μm congruent with the metal mirror.

In the method, the same photomask is preferably used for steps B) and C) in order to structure the protective layer and/or the adhesion promoting layer by means of etching and in order to apply the metal mirror in a structured manner. The photomask is preferably composed of two or more than two non-congurent running partial layers.

The optoelectronic semiconductor chip thus comprises in particular
a semiconductor layer sequence with an active zone for generating a radiation,
a metal mirror for the radiation on a rear side opposite a light extraction side, in particular of silver,
a protective metal layer corresponding to the protective metallization on a side of the metal mirror remote from the semiconductor layer sequence, in particular of TiW, and
a dielectric protective layer corresponding to the adhesion promoting layer,
wherein the dielectric protective layer, as viewed in cross-section, lies partly between the metal mirror and the protective metal layer and, as viewed in plan view, lies partly next to the metal mirror.

BRIEF DESCRIPTION OF THE DRAWINGS

In the following, an optoelectronic semiconductor chip described here is explained in more detail with reference to the drawings using exemplary embodiments. Identical reference signs indicate identical elements in the individual figures. However, references are not shown true to scale; individual elements may be shown in exaggerated size for better understanding.

In the figures.

DETAILED DESCRIPTION

Figure 1:
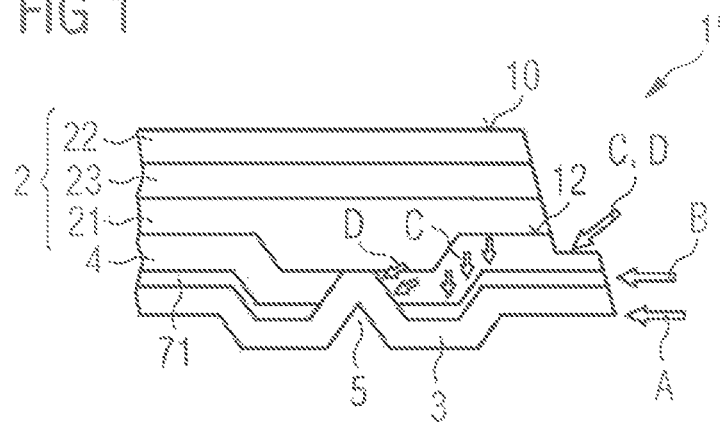
FIG. 1 shows a schematic sectional view of a modification of a semiconductor chip.

FIG. 1 illustrates a modification 1' of a semiconductor chip. The modification 1' comprises a semiconductor layer sequence 2 with an active zone 23 for generation of radiation. The active zone 23 is located between a first side 21 and a second side 22 of the semiconductor layer sequence 2. A reflector 4 is located at a rear side 12 of the semiconductor layer sequence 2. The reflector 4 is made of a material transparent to the radiation generated during operation. A reflection effect of the reflector 4 is based in particular on a refractive index difference towards the semiconductor layer sequence 2 and/or on total reflection. The rear side 12 is opposite to a light extraction side 10.

On a side of the reflector 4 facing away from the semiconductor layer sequence 2 an adherent layer 71 is arranged, via which a metal mirror 3 is attached to the reflector 4. The reflector 4, for example, is made of a silicon dioxide layer. The adherent layer 71 is a layer of a transparent conductive oxide, TCO for short, such as zinc oxide or ITO. The metal mirror 3 is made of gold. The semiconductor layer sequence 2 is based on AlInGaAs or on AlInGaP.

Since the adherent layer 71 is made of a TCO, the adherent layer 71 does not form a tight barrier against the penetration of moisture or other substances harmful to the metal mirror 3. Similarly, penetration of harmful substances for the metal mirror 3 is possible through the reflector 4. Furthermore, there is no additional protection for the metal mirror 3 from the rear side 12 or from side edges.

This means that moisture or other harmful substances for the metal mirror 3 can penetrate from the side edges of the mirror 3, see path A. A diffusion of harmful materials can also occur from the side via the adherent layer 71, see path B. Corrosion of the metal mirror 3 can occur over a large area through the adherent layer 71 via the reflector 4, see path C. Furthermore, an attack on the metal mirror 3 can occur across the reflector 4 at a through-connection 5, see path D.

The modification 1' of FIG. 1, allows only the usage materials such as gold for the metal mirror 3, which show a high stability under the influence of moisture or other environmental influences. However, gold has a comparatively low reflectivity, especially towards shorter wavelengths.

Figure 2:
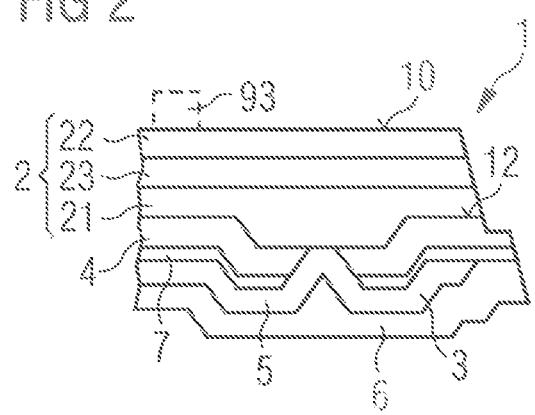
FIGS. 2 to 8 show schematic sectional views of exemplary embodiments of optoelectronic semiconductor chips described here, and FIGS. 9A to 9E schematic sectional views of process steps of an exemplary embodiment of a method for producing an optoelectronic semiconductor chip described here.

FIG. 2 shows an exemplary embodiment of an optoelectronic semiconductor chip 1. In contrast to the modification 1' of FIG. 1, an adhesion promoting layer 7 is present, which also serves as a barrier layer. The adhesion promoting layer 7 is impermeable or essentially impermeable to moisture or other substances harmful to the metal mirror 3. Thus, no moisture or other harmful substances can reach the metal mirror 3 from the side or via the reflector 4. The metal mirror 3 is preferably a silver mirror.

For example, the adhesion promoting layer 7 is an aluminum oxide layer produced by atomic layer deposition, ALD for short. A thickness of the adhesion promoting layer 7 is preferably at least 1 nm or 5 nm and/or at most 50 nm or 40 nm. In the case of an aluminum oxide layer, the thickness of the adhesion promoting layer 7 is preferably between 20 nm and 40 nm inclusive, in particular around 30 nm.

The adhesion promoting layer 7 is located directly between the reflector 4, which is for example made of silicon dioxide, and the metal mirror 3. The metal mirror 3 is located on the first side 21 of the semiconductor layer sequence 2. The first side 21 is preferably p-doped.

On a side facing away from the semiconductor layer sequence 2 there is a protective metallization 6 directly at the metal mirror 3. The protective metallization 6 can be formed by a single metal layer, but preferably the protective metallization 6 is formed by several successive metal layers.

For example, protective metallization 6 is a layer stack of Ti—Pt or Ti—Pt—Ti or TiW or Ti—TiW or Cr—Pt or Cr—Pt—Ti.

A layer of the adhesion promoting layer 7 closest to the metal mirror 3 preferably contains Ti and/or Cr and can serve as an additional adherent layer. Such an adherent layer closest to the metal mirror 3 preferably has a thickness between 1 nm and 10 nm inclusive. A total thickness of the protective metallization 6 is preferably at least 50 nm or 100 nm and/or at most 1.5 µm or 1 µm or 500 nm.

The protective metallization 6 is preferably dimensionally stable, so that a form of protective metallization 6 does not change or does not change significantly during intended use and intended assembly of the semiconductor chip 1. In particular, protective metallization 6 is not a solder for mounting the semiconductor chip 1.

Furthermore, FIG. 2 shows that the semiconductor layer sequence 2 comprises a structuring. This means that the semiconductor layer sequence 2 is 5 thicker in the region of the electrical through-connection than in other regions. By structuring the semiconductor layer sequence 2 in this way, it is possible to ensure that the active zone 23, particularly directly below any metallic current distribution structures 93 on the light extraction side 10, is not or only slightly energized. In addition, such a structuring of the semiconductor layer sequence 2 can increase light extraction efficiency, since light can be deflected or scattered at this structuring. The structuring is optional.

In the region of the through-connection 5, the metal mirror 3 penetrates the reflector 4. The semiconductor layer sequence 2 is directly electrically contacted by the metal mirror 3. The adhesion promoting layer 7 is only applied to the reflector 4 from the rear side 12, so that side surfaces of the through-connection 5, formed by the metal mirror 3, are free of the adhesion promoting layer 7. In the region of the reflector 4, the metal mirror 3 is thus directly adjacent to the reflector 4 in the lateral direction. Thus, the metal mirror 3 is in direct electrical contact with the semiconductor layer sequence 2.

The metal mirror 3 may extend with a constant thickness over the semiconductor layer sequence 2. This means that the protective metallization 6 can come relatively close to the semiconductor layer sequence 2 in the region of the through-connection 5. Optionally, it is possible for the protective metallization 6 to serve as a planarization on the rear side 12, in contrast to FIG. 2. In this way a flat mounting side of the semiconductor chip 1 can be achieved on the protective metallization 6. A thickness of the metal mirror 3 is preferably at least 30 nm or 70 nm and/or at most 500 nm or 300 nm.

It is possible that the reflector 4, the adhesion promoting layer 7 and the protective metallization 6 protrude laterally beyond the semiconductor layer sequence 2. The metal mirror 3 preferably ends laterally with the semiconductor layer sequence 2. At the edge of the semiconductor chip 1, the protective metallization 6 is thus preferably in direct contact with the adhesion promoting layer 7 all around. As a result, the metal mirror 3 is tightly encapsulated laterally by the adhesion promoting layer 7 together with the protective metallization 6.

This type of encapsulation of the metal mirror 3 makes it possible to use materials such as silver, which are relatively susceptible to moisture, for the metal mirror 3. Thus, an increased reflectivity of the metal mirror 3 can be achieved, especially in comparison to gold mirrors.

As in all other exemplary embodiments, it is possible that the reflector 4 is not formed by a single, comparatively thick radiation-transmitting layer. Layer stacks of layers with alternating high and low refractive indices can be used for the reflector 4, similar to a Bragg mirror.

The semiconductor layer sequence 2 is based on AlInGaP or on AlInGaAs. In the active zone 23, green light, yellow light, orange light and/or red light is preferably generated during operation. It is also possible that the active zone 23 is configured to generate infrared or near infrared radiation.

It is possible to form one or more additional layers on the metal mirror 3 towards the protective metallization 6, for example layers of ZnO or other TCO materials or of TiW or other metals. Such an undrawn layer makes it possible to protect the metal mirror 3 from oxidation in subsequent process steps. In particular, a ZnO layer is formed on the side of the Ag metal mirror 3 facing away from the semiconductor layer sequence 2 to prevent oxidation of the silver.

The adhesion promoting layer 7 can form a multi-layer encapsulation. To simplify the illustration, however, the adhesion promoting layer 7 is always shown as a single layer in the figures.

The protective metallization 6, the adhesion promoting layer 7 and the reflector 4 can be flush with each other in the lateral direction.

Unless otherwise indicated, the statements given in connection with FIG. 2 applies to all subsequent exemplary embodiments.

Figure 3:
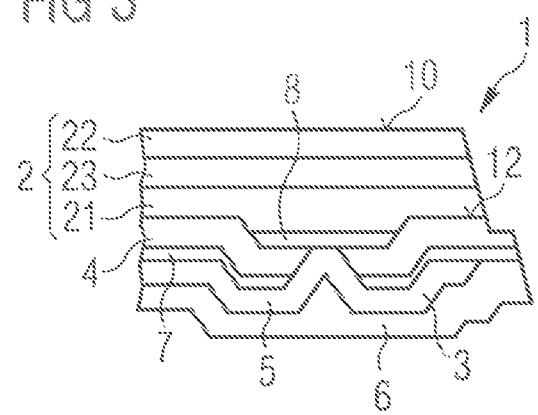

The exemplary embodiment of FIG. 3 comprises an additional contact layer 8 compared to FIG. 2. The contact layer 8, for example, is made of a transparent conductive oxide such as ITO, but can also be made of a thin metal layer such as Ti, Pt or Pd or Au or Ag. In the case of a metal layer, contact layer 8 preferably has a thickness of 10 nm or 5 nm at most.

In the case of a TCO, the contact layer 8 preferably has a thickness of at least 10 nm and/or at most 400 nm, in particular between 30 nm and 60 nm inclusive.

It is possible that the contact layer 8 is limited to the structuring, i.e. to regions of greater thickness of the semiconductor layer sequence 2. Thus the contact layer 8 covers the rear side 12 of the semiconductor layer sequence 2 only in the region of the through-connection 5. Alternatively, it is possible that the contact layer 8 extends continuously over the semiconductor layer sequence 2 and covers the rear side 12 completely or almost completely.

Figure 4:
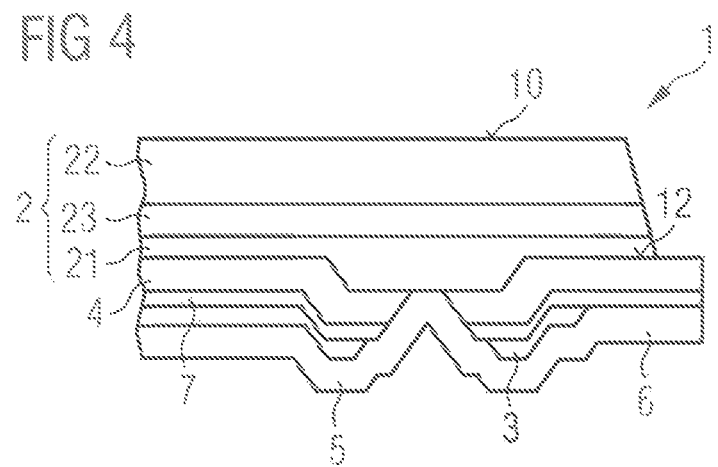

In the exemplary embodiment of FIG. 4, the through-connection 5 is formed by the protective metallization 6. This means that the metal mirror 3 is completely encapsulated by the adhesion promoting layer 7 together with the protective metallization 6. The metal mirror 3 and the adhesion promoting layer 7 are each applied flat to the reflector 4. Thus, only the protective metallization 6 penetrates the reflector 4 towards the semiconductor layer sequence 2.

In order to achieve this geometry of the through-connection 5, the adhesion promoting layer 7 and the metal mirror 3 are deposited before the openings of the through-connections 5 are structured. The reflector 4 is also opened. In a first photolithography step, a part of the metal mirror 3 is removed from an edge region of the semiconductor chip 1. In a second photolithography step, the reflector 4, the adhesion promoting layer 7 and the metal mirror 3 are removed to fill the through-connection 5 with a material of protective metallization 6. In a final step, the protective metallization 6 is deposited.

Here, the encapsulating metal of protective metallization 6 also is the electrical contact metal for the semiconductor layer sequence 2. One advantage of this embodiment is that Ag does not become part of the electrical contact surface and is therefore not exposed to high current densities. However, this places additional restrictions on the choice of material for the protective metallization 6: This material must form a low-resistance electrical contact to the semiconductor layer sequence 2 and enable the encapsulation of the metal mirror 3.

Figure 5:
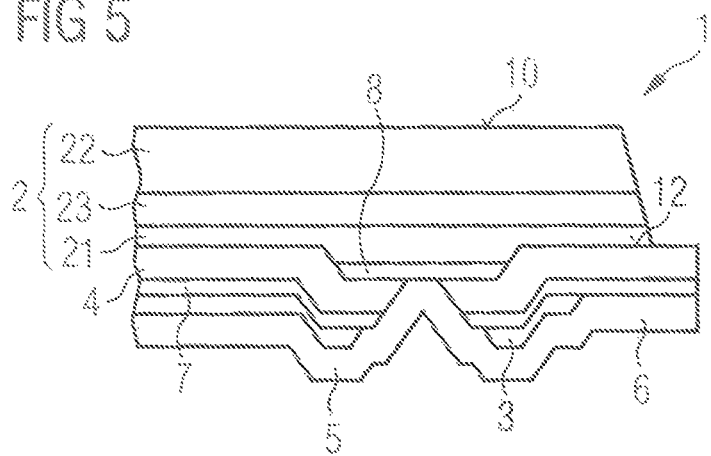

The exemplary embodiment of FIG. 5 corresponds to that of FIG. 4, wherein the contact layer 8 is also present. The TCO contact layer 8 is restricted to the region of through-connection 5 and to the thicker regions of the semiconductor layer sequence 2 at through-connection 5.

Thus, the electrical contact to the semiconductor layer sequence is formed by a TCO and the only requirement for the material of the protective metallization 6 is to form an electrical contact to this TCO layer. This has two advantages in particular: Firstly, the Ag of the metal mirror 3 is also completely encapsulated in the electrical contact region. Secondly, the choice of material for protective metallization 6 is less restricted, since the formation of a good metal-TCO contact is much easier than a good metal-semiconductor contact.

Figure 6:
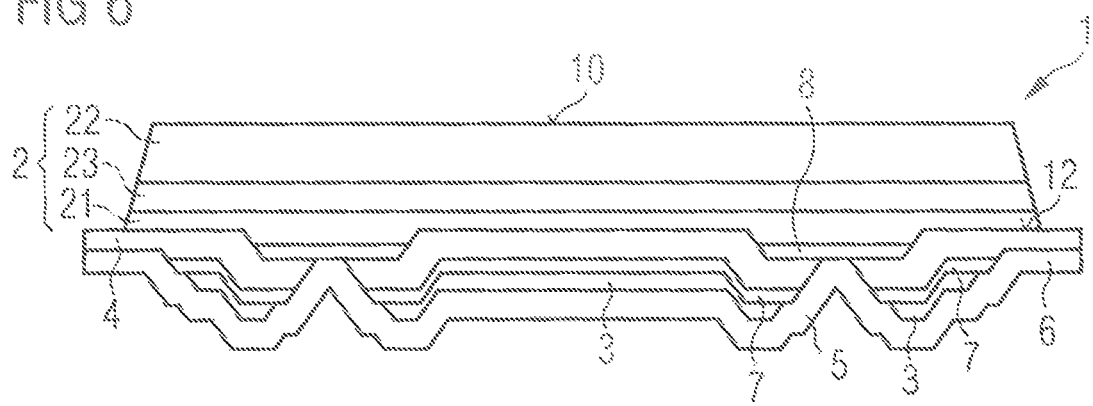

In the exemplary embodiment of FIG. 6 it is shown that the adhesion promoting layer 7 is removed from an edge of the semiconductor chip 1. Here, the adhesion promoting layer 7 preferably protrudes laterally beyond the metal mirror 3, wherein a protrusion of the adhesion promoting layer 7 beyond the metal mirror 3 is preferably at least 0.5 μm or 1 μm or 2 μm and/or at most 10 μm or 5 μm. Thus, the material of the adhesion promoting layer 7 is not exposed laterally. By removing the adhesion promoting layer 7 in the edge region, it is possible that the reflector 4 also has a reduced thickness in the edge region.

In this case, there is preferably good adhesion of the protective metallization 6 to the reflector 4, but not necessarily to the adhesion promoting layer 7, which is made of aluminum oxide in particular. An additional layer may be applied near the chip edge, not drawn, to achieve increased adhesion between the protective metallization 6 and the reflector 4.

There are other processing variants which lead to the semiconductor chips 1 described in FIGS. 2 to 6. For example, a structuring of the Ag metal mirror 3 at the edge and in the contact openings can be achieved with two different photolithography steps. It is advantageous to structure the Ag layer immediately before applying the protective metallization 6 in order to avoid a photoresist on the adhesion promoting layer 7 in the chip edge region. A photoresist on the aluminum oxide adhesion promoting layer 7 can negatively influence the adhesion properties after a resist removal step.

The protective metallization 6 covers an outer edge of the metal mirror 3 as well as side surfaces of the adhesion promoting layer 7 preferably completely. Thus, a tight encapsulation of the adhesion promoting layer 7 together with protective metallization 6 is formed at the edge of the metal mirror 3. At the edge of the semiconductor chip 1, especially all around it, the protective metallization 6 is preferably applied directly on the reflector 4.

In FIG. 6, the semiconductor chip 1 shows only two of the through-connections 5 in cross-section. It is possible that there is a larger number of through-connections 5 present.

Figure 7:
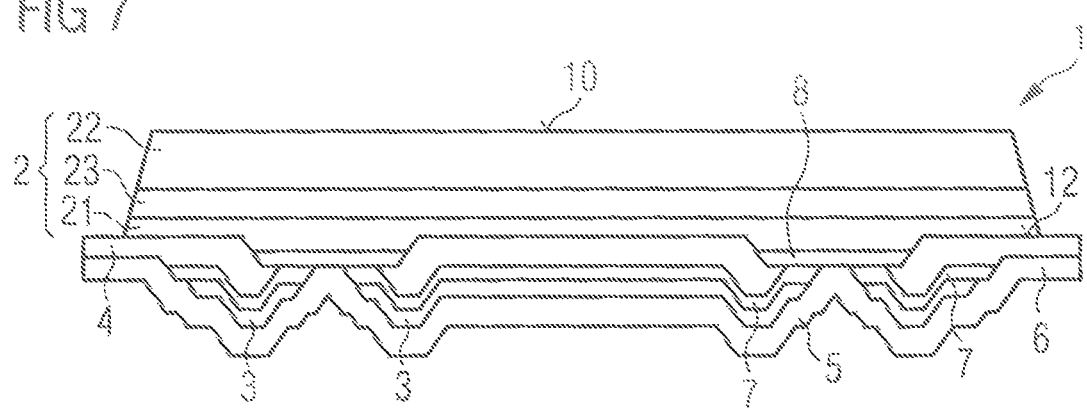

In the exemplary embodiment of FIG. 7, the semiconductor layer sequence 2 is electrically contacted from the rear side 12 via the optional contact layer 8 and via the protective metallization 6. The metal mirror 3 and the adhesion promoting layer 7 are applied to the side surfaces of the through-connections 5. Thus the metal mirror 3 almost reaches the semiconductor layer sequence 2 and/or the contact layer 8. In particular, the adhesion promoting layer 7 is preferably flush with the protective metallization 6 in a direction towards the semiconductor layer sequence 2. This means that the contact layer 8 can directly border the protective metallization 6 as well as on the adhesion promoting layer 7.

This geometry from FIG. 7, according to which the adhesion promoting layer 7 covers the side surfaces of the through-connection 5, may also be found in the exemplary embodiments of FIG. 2 or 3. If the adhesion promoting layer 7 is electrically conductive, the metal mirror 3 or the protective metallization 6 can be completely covered by the adhesion promoting layer 7 in the exemplary embodiments of FIG. 2 or 3 or in the exemplary embodiment of FIG. 7. This means that even in the region of the through-connections 5, the adhesion promoting layer 7 may then extend continuously over the metal mirror 3 and/or the protective metallization 6. In this case, the adhesion promoting layer 7 lies between the contact layer 8 and the protective metallization 6.

With this geometry of the metal mirror 3, an enlargement of the reflection region of the metal mirror 3 can be achieved. In this variant, the adhesion promoting layer 7 and the metal mirror 3 are deposited after structuring the dielectric reflector 4, i.e., contact openings are etched. With a second photolithography mask, the adhesion promoting layer 7 and the metal mirror 3 are removed from the electrical contact surface and from the chip edge in a common step. Then the protective metallization 6 is applied.

Figure 8:
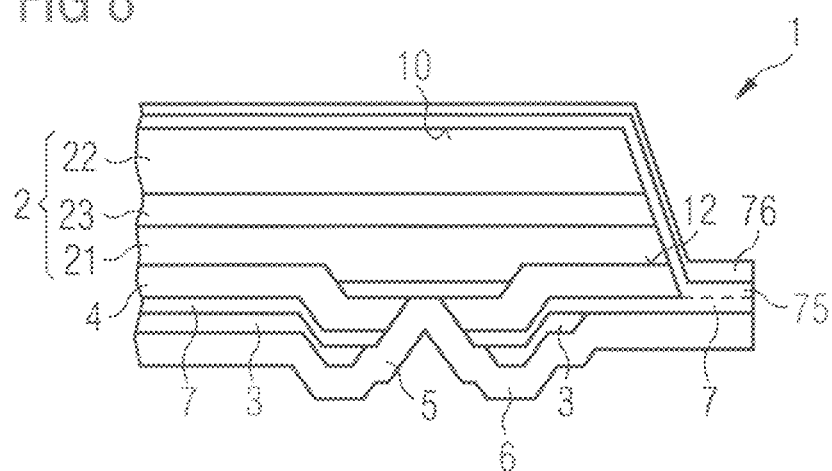

The exemplary embodiment of FIG. 8 is based in particular on the exemplary embodiment of FIG. 5. Here, the reflector 4 is removed laterally next to the semiconductor layer sequence 2; this removal is preferably carried out during mesa etching, i.e., during the creation of the separation trenches. From the light extraction side 10, a cover layer 75 extends over the side surfaces of the semiconductor layer sequence 2 up to the adhesion promoting layer 7. The adhesion promoting layer 7 and the cover layer 75 are preferably made of the same material, especially aluminum oxide. The layers 7, 75 are preferably produced by atomic layer deposition. In this way, a particularly tight encapsulation of the metal mirror 3 can also be achieved from the light extraction side 10 and the side surfaces of the semiconductor layer sequence 2.

Optionally, a moisture protection layer 76 may be applied to the cover layer 75. The moisture protection layer 76 is a nitride like silicon nitride, for example. The moisture protection layer 76 can also be used as an anti-reflective layer, for example together with the cover layer 75. For example, the moisture protection layer 76 is produced by CVD or PVD. The moisture protection layer 76 is preferably thicker than the cover layer 75.

Such a cover layer 75 and/or such a moisture protection layer 76 may also be present in all exemplary embodiments according to the example of FIG. 8.

For example, before applying electrical contacts on the light extraction side 10, in particular on the n-doped second side 22 of the semiconductor layer sequence 2, the dielectric reflector 4 is opened in the separation trench so that the adhesion promoting layer 7 deposited on the p-side 21 is exposed. This can be done in a separate photolithography step or in the same photolithography step as the mesa etching.

Subsequently, the aluminum oxide cover layer 75 is then deposited, which can cover the entire chip surface and which is arranged on the adhesion promoting layer 7 in the separation trench. Thus both layers 7, 75 act as moisture barriers and all moisture paths are closed.

FIGS. 9A to 9E describe a method for producing a semiconductor chip 1. According to FIG. 9A, the semiconductor layer sequence 2 is grown on a growth substrate 20. After growing the semiconductor layer sequence 2, structuring can be optionally carried out so that thicker regions result for the subsequent through-connections 5, not shown in FIG. 9A. It is also optionally possible to apply the contact layer not drawn in FIG. 9A locally or over the entire surface.

The reflector 4 is created after the semiconductor layer sequence 2 has been grown and optionally after the contact layer has been applied and/or the semiconductor layer sequence 2 has been structured.

Figure 9A:
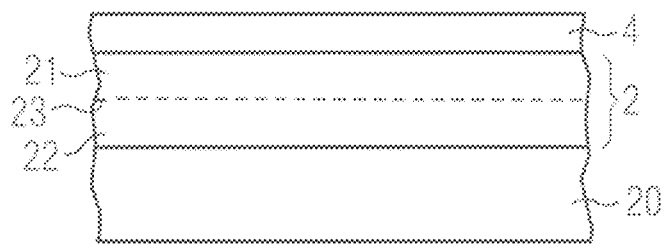
Figure 9B:
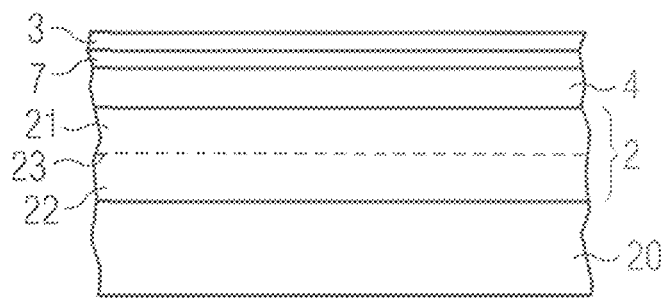

FIG. 9B illustrates that the reflector 4 is preferably covered with the adhesion promoting layer 7. If a structuring not shown in FIG. 9B is present, the adhesion promoting layer 7 preferably forms exactly to such a structuring. The adhesion promoting layer 7 is created by atomic layer deposition.

Subsequently, the metal mirror 3 is created, for example by evaporation. If necessary, the metal mirror 3 and the adhesion promoting layer 7 can be structured subsequently, i.e., removed in places, not shown in FIG. 9B.

Neither a structuring for the optional through-connections 5 is drawn in FIGS. 9A to 9E. The through-connections 5 can be omitted if the reflector 4 and the adhesion promoting layer 7 are electrically conductive. In this case, the reflector 4 and the adhesion promoting layer 7 are made of a transparent conductive oxide or of different transparent conductive oxides, for example.

Figure 9C:
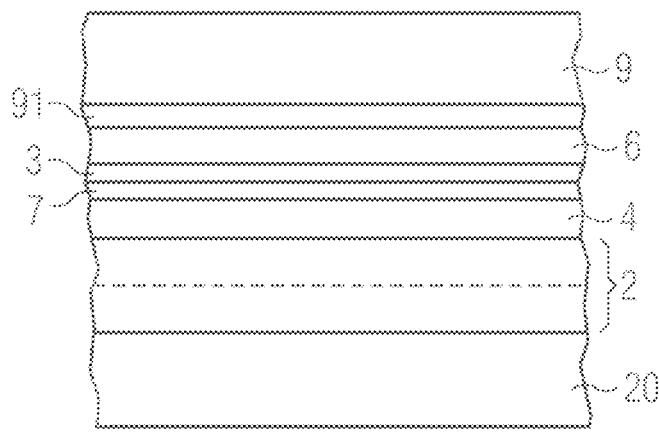

In the process step of FIG. 9C it is shown that protective metallization 6 is applied to the metal mirror 3. Again, any structuring of the protective metallization 6 is not illustrated.

Optionally, protective metallization 6 is followed by a bonding agent 91 like a solder. Furthermore, the semiconductor layer sequence 2 is connected to a carrier 9 on the side of the metal mirror 3. In particular, the carrier 9 may be arranged on the protective metallization 6 by soldering.

Figure 9D:
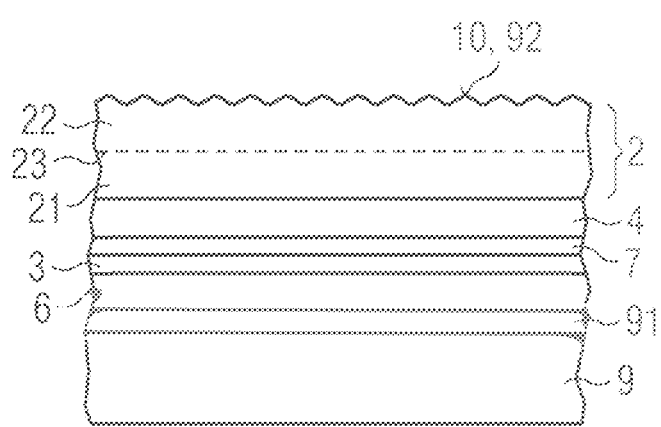

As shown in FIG. 9D, the growth substrate 20 has been removed from the semiconductor layer sequence 2. Optionally, a roughening 92 is created to improve light extraction on the light extraction side 10.

Figure 9E:
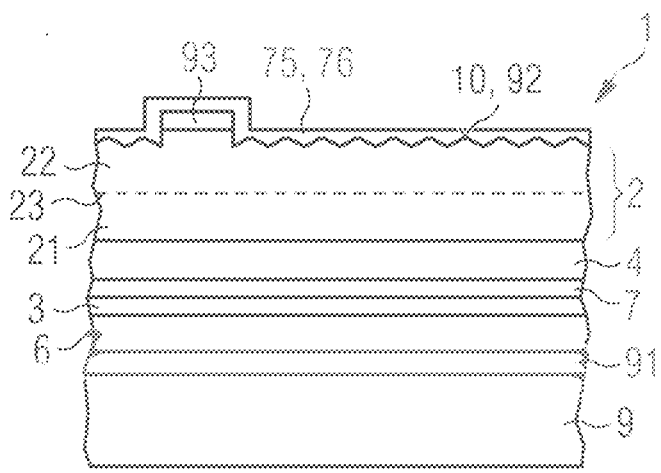

FIG. 9E illustrates that a current distribution structure 93 may be applied to the light extraction side 10, for example, formed by lattice-like or strip-like metal strips. Alternatively, a layer of a transparent conductive oxide may be used as the current distribution structure.

Furthermore, FIG. 9E illustrates that optionally the cover layer 75 and/or the moisture protection layer 76 may be applied.

In general, the requirements for the correct choice of the adhesion promoting layer 7 are as follows: Good adhesion between the dielectric reflector 4 and the metal mirror 3; high uniformity and conformity during application; acting as a moisture barrier, at least when the adhesion promoting layer 7 is placed between other layers; low absorption in the wavelength range emitted by the semiconductor chip 1. As an alternative to ALD, the adhesion promoting layer 7 can also be deposited using a thin-film deposition technique such as Plating or Chemical Vapor Deposition, CVD for short.

During processing, the metal mirror 3 usually comes into contact with air. To avoid oxidation, the metal mirror 3 should therefore be covered by a thin layer of another material, especially with ZnO, ITO or TiW. This material may finally be removed, if necessary, immediately before the deposition of the protective metallization 6, for example by sputtering. The protective metallization 6 is preferably stable to moisture and adheres well to the metal mirror 3 and to the adhesion promoting layer 7.

Unless otherwise indicated, the components shown in the figures follow one another, preferably in the order given. Layers not touching each other in the figures are preferably spaced apart. If lines are drawn parallel to each other, the corresponding surfaces are preferably aligned parallel to each other. Likewise, unless otherwise indicated, the relative positions of the drawn components to each other are correctly shown in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

We claim:

1. An optoelectronic semiconductor chip comprising:
   a semiconductor layer sequence with an active zone for generating a radiation;
   a metal mirror for the radiation;
   a protective metallization on a side of the metal mirror facing away from the semiconductor layer sequence; and
   an adhesion promoting layer on a side of the metal mirror facing the semiconductor layer sequence,
   wherein the adhesion promoting layer is an encapsulation layer for the metal mirror so that the metal mirror is completely encapsulated at an outer edge by the adhesion promoting layer together with the protective metallization.

2. The optoelectronic semiconductor chip according to claim 1, comprising one or more metallic electrical through-connections which extend directly up to a side of the semiconductor layer sequence facing the metal mirror or directly up to a contact layer of a transparent conductive oxide and terminate at a distance from the active zone,
   wherein the at least one through-connection is formed in a region closest to the semiconductor layer sequence by the protective metallization,
   wherein the adhesion promoting layer and the protective metallization project laterally beyond the semiconductor layer sequence, and
   wherein the metal mirror is completely encapsulated at all edges by the adhesion promoting layer together with the protective metallization and, viewed in cross-section, borders exclusively to the protective metallization together with the adhesion promoting layer.

3. The optoelectronic semiconductor chip according to claim 1, wherein
   the metal mirror is a silver mirror,
   the adhesion promoting layer is made of aluminum oxide,
   the protective metallization is a layer stack of several metal layers, and
   a region between the semiconductor layer sequence and the protective metallization is free of cavities.

4. The optoelectronic semiconductor chip according to claim 1,
   further comprising at least one metallic electrical through-connection,
   wherein the through-connection extends up to a side of the semiconductor layer sequence facing the metal mirror and terminates at a distance from the active zone.

5. The optoelectronic semiconductor chip according to claim 4,
   wherein the adhesion promoting layer is removed from a region of the through-connection nearest to the semiconductor layer sequence,
   wherein the adhesion promoting layer partially or completely covers side flanks of the through-connection.

6. The optoelectronic semiconductor chip according to claim 4, wherein the through-connection is formed in a region closest to the semiconductor layer sequence by the metal mirror.

7. The optoelectronic semiconductor chip according to claim 6, wherein the protective metallization in the through-connection is closer to the semiconductor layer sequence than adjacent regions of the metal mirror.

8. The optoelectronic semiconductor chip according to claim 4, wherein the through-connection is formed in a region closest to the semiconductor layer sequence by the protective metallization.

9. The optoelectronic semiconductor chip according to claim 4, further comprising a contact layer,
   wherein in region of the through-connections the semiconductor layer sequence has a greater thickness in each case, and
   wherein the contact layer is restricted to the regions with the greater thickness.

10. The optoelectronic semiconductor chip according to claim 1,
    further comprising a reflector of at least one material which is transparent for the radiation generated during operation,
    wherein the reflector is located directly between the semiconductor layer sequence and the adhesion promoting layer.

11. The optoelectronic semiconductor chip according to claim 10,
    wherein the reflector is electrically insulating and is penetrated by the through-connection,
    wherein the reflector projects beyond the semiconductor layer sequence and/or the metal mirror when viewed in plan view.

12. The optoelectronic semiconductor chip according to claim 11, wherein the reflector directly adjoins the protective metallization in regions which, seen in plan view, are located next to the semiconductor layer sequence.

13. The optoelectronic semiconductor chip according to claim 1, wherein the adhesion promoting layer and the protective metallization project laterally beyond the semiconductor layer sequence.

14. The optoelectronic semiconductor chip according to claim 1,
    further comprising a contact layer of a transparent conductive oxide,
    wherein the contact layer directly adjoins the semiconductor layer sequence and is electrically ohmically connected to the metal mirror.

15. The optoelectronic semiconductor chip according to claim 1,
    wherein the adhesion promoting layer has a uniform, constant thickness at least over the metal mirror,
    wherein different regions of the adhesion promoting layer do not overlap each other.

16. The optoelectronic semiconductor chip according to claim 1,
further comprising a cover layer which extends from the light extraction side over side flanks of the semiconductor layer sequence up to the adhesion promoting layer, so that the semiconductor layer sequence is enclosed by the cover layer together with the adhesion promoting layer and the protective metallization in at least one cross-sectional view,
wherein the cover layer and the adhesion promoting layer are made of the same material.

17. The optoelectronic semiconductor chip according to claim 16, in which the cover layer is covered with a moisture protection layer.

18. The optoelectronic semiconductor chip according to claim 1, wherein the adhesion promoting layer is spaced apart from the semiconductor layer sequence,
and wherein on a side facing the semiconductor layer sequence the adhesion promoting layer is exclusively in contact with a reflector.

19. The optoelectronic semiconductor chip according to claim 1, wherein, on a side facing away from the adhesion promoting layer, a reflector is in direct contact with both, a rear side of the semiconductor layer sequence and a contact layer.

20. An optoelectronic semiconductor chip comprising:
a semiconductor layer sequence with an active zone for generating a radiation;
a metal mirror for the radiation;
a protective metallization directly on a side of the metal mirror facing away from the semiconductor layer sequence; and
an adhesion promoting layer directly on a side of the metal mirror facing the semiconductor layer sequence; and
wherein the adhesion promoting layer is an encapsulation layer for the metal mirror so that the metal mirror is completely encapsulated by the adhesion promoting layer together with the protective metallization.

* * * * *